United States Patent

Chen

[11] Patent Number: 6,034,736
[45] Date of Patent: Mar. 7, 2000

[54] DIGITAL HORIZONTAL FLYBACK CONTROL CIRCUIT

[75] Inventor: Yung-Jann Jerry Chen, Taiipei, Taiwan

[73] Assignee: Motorola, Inc., Schaumburg, Ill.

[21] Appl. No.: 08/986,483

[22] Filed: Dec. 8, 1997

[30] Foreign Application Priority Data

Dec. 19, 1996 [SG] Singapore ............................. 9611864

[51] Int. Cl.⁷ .................................................... H03L 7/00
[52] U.S. Cl. .......................................... 348/540; 348/541
[58] Field of Search ..................... 348/540, 541, 348/542, 543, 546, 530, 531; 315/364, 387; H04N 5/12; H03L 7/00

[56] References Cited

U.S. PATENT DOCUMENTS 5,247,229   9/1993   Ngo et al. ................................. 348/540
5,760,839   6/1998   Sumiyoshi .............................. 348/541

Primary Examiner—Michael H. Lee
Attorney, Agent, or Firm—Rennie W. Dover

[57] ABSTRACT

A digital horizontal flyback control circuit for controlling the horizontal position of a video signal on a monitor screen receives a horizontal drive signal (21) and a flyback signal (22) generated when a video display beam is caused to move from the end of one line of the display to the beginning of a next line by an edge of a pulse of the horizontal drive signal, the flyback pulse being delayed with respect to the horizontal drive signal pulse by a flyback delay period. A measuring circuit (15) measures the flyback delay period and a subtractor circuit (17) subtracts the flyback delay from a set horizontal position (18) representing a desired delay between the flyback pulse and a reference pulse (11). A comparator (19) compares the subtraction value with the value of a clock counter (23) whose count value is reset by the reference pulse (11) and produces a set signal at an output when the subtraction value and the clock count value are the same so as to generate the horizontal drive signal pulse (21).

3 Claims, 2 Drawing Sheets

DIGITAL HORIZONTAL FLYBACK CONTROL CIRCUIT

FIELD OF THE INVENTION

This invention relates to a digital horizontal flyback control circuit for controlling the horizontal position of a video signal on a monitor screen.

BACKGROUND OF THE INVENTION

As is known, the horizontal position of an electron beam on the screen of a cathode ray tube (CRT) is dependent on a horizontal drive signal provided by a deflection control integrated circuit (IC), which has generally been an analogue IC. The horizontal drive signal comprises a pulse having a period corresponding to the length of each line of the video signal to be displayed on the CRT. One edge of the horizontal drive signal pulse is used to control the electron beam to "flyback" from the end of one line on the CRT to the beginning of the next line by changing the direction of the current through the magnetic coils controlling the position of the electron beam. When this happens, the sudden change in direction of current through the coils causes a voltage "flyback" pulse to be generated. However, there is a delay between the timing of the edge of the horizontal drive signal pulse and the flyback pulse. This delay is variable depending on various factors, including the type of monitor and resolution being used and the ambient temperature and is not programmable.

A horizontal synchronisation signal is also provided having a horizontal synchronisation pulse for timing purposes. The frequency of the horizontal synchronisation signal is the same as the frequency of the horizontal drive signal, but the two signals are not necessarily in phase with each other, since the horizontal drive signal must be adjusted to compensate for the variability of the flyback delay and in order to adjust the horizontal position of the video signal displayed on the CRT screen.

The actual horizontal position of the video signal on the CRT screen is set by a horizontal position delay between the timing of an edge of the horizontal synchronisation pulse and the flyback pulse. However, since the timing of the flyback pulse is variably delayed with respect to the timing of the edge of the horizontal drive pulse, it is necessary to have some way of generating the horizontal drive signal such that the edge of the horizontal drive signal pulse is generated at the correct time to cause the flyback pulse to occur with the set horizontal position delay after the edge of the horizontal synchronisation pulse.

BRIEF SUMMARY OF THE INVENTION

Accordingly, the invention provides a digital horizontal flyback control circuit comprising:

a first input for receiving a horizontal drive signal comprising a series of pulses;

a second input for receiving a flyback signal comprising a series of flyback pulses generated when a video display beam is caused to move from an end of one line of a display to a beginning of a next line of the display by a predetermined edge of a horizontal drive signal pulse, the corresponding flyback pulse being delayed with respect to the corresponding horizontal drive signal pulse by a flyback delay period;

a measuring circuit coupled to the first and second inputs for measuring the flyback delay period and producing a flyback delay value at an output thereof;

a subtractor circuit coupled to the output of the measuring circuit for subtracting the flyback delay value from a set horizontal position value representing a desired delay between the flyback pulse and a reference pulse and producing a subtraction value at an output thereof;

a comparator coupled to the output of the subtractor circuit for comparing the subtraction value with the value of a clock counter whose count value is reset by the reference pulse and producing a set signal at an output when the subtraction value and the clock count value are the same; and a control circuit having an input coupled to the output of the comparator for generating a control signal at an output thereof for controlling the horizontal drive signal such that the horizontal drive signal pulse is generated when the set signal is received from comparator.

In a preferred embodiment, the digital horizontal flyback control circuit further comprises:

a phase locked loop (PLL) having an input for receiving a horizontal synchronisation signal at a synchronisation frequency and an output for providing a clock signal generated from the horizontal synchronisation signal at a clock frequency, the clock frequency being higher than the synchronisation frequency, the PLL including a PLL counter for counting the clock signal at the clock signal frequency and having an output for providing a clock count value;

a horizontal drive signal generator for generating a horizontal drive signal comprising a series of pulses;

a flyback delay counter having a clock input coupled to the output of the PLL for receiving the clock signal, a first input for receiving the horizontal drive signal, and a second input for receiving a flyback signal comprising a series of pulses generated when a video display beam is caused to move from an end of one line of a display to a beginning of a next line of the display by a predetermined edge of a horizontal drive signal pulse, the flyback pulse being delayed with respect to the horizontal drive signal pulse by a flyback delay period, the counter being arranged to count, at the clock frequency, starting when the predetermined edge of a pulse of the horizontal drive signal is received until the flyback pulse is received and then to produce a flyback delay count value at an output thereof;

a subtractor circuit having a first input for receiving a set position value representative of a desired horizontal position of the video display beam on the display, a second input coupled to the output of the flyback delay circuit for receiving the flyback delay count value and an output for providing a horizontal drive delay value produced by subtracting the flyback delay count value from the set position value;

a comparator having a first input coupled to the output of the subtractor circuit for receiving the flyback delay count value, a second input coupled to the output of the PLL counter for receiving the clock count value and an output for providing a reset signal when the flyback delay count value and the clock count value are the same; and a latch circuit having a reset input coupled to the output of the comparator for receiving the reset signal therefrom and for generating a latch output signal at an output thereof when the reset signal is received;

wherein the output of the latch circuit is coupled to the horizontal drive signal generator for controlling the horizontal drive signal generator to generate the horizontal drive signal such that the predetermined edge of the horizontal drive signal occurs when the latch output signal is received by the horizontal drive signal generator.

Preferably, the digital horizontal flyback control circuit further comprises:

a horizontal drive counter having a clock input coupled to the output of the PLL for receiving the clock signal, a first input for receiving the horizontal drive signal, and a second input for receiving a set value representative of a desired pulse width of the horizontal drive signal, the counter being arranged to count, at the clock frequency, starting when the predetermined edge of a pulse of the horizontal drive signal is received until the set value is reached and then to produce a set signal at an output thereof;

wherein the latch circuit has a set input coupled to the output of the horizontal drive counter for receiving the set signal therefrom and for generating the latch output signal when the set signal is received.

BRIEF DESCRIPTION OF THE DRAWINGS

One embodiment of the invention will now be more fully described, by way of example, with reference to the drawings, of which.

DETAILED DESCRIPTION OF THE DRAWINGS

Figure 2:
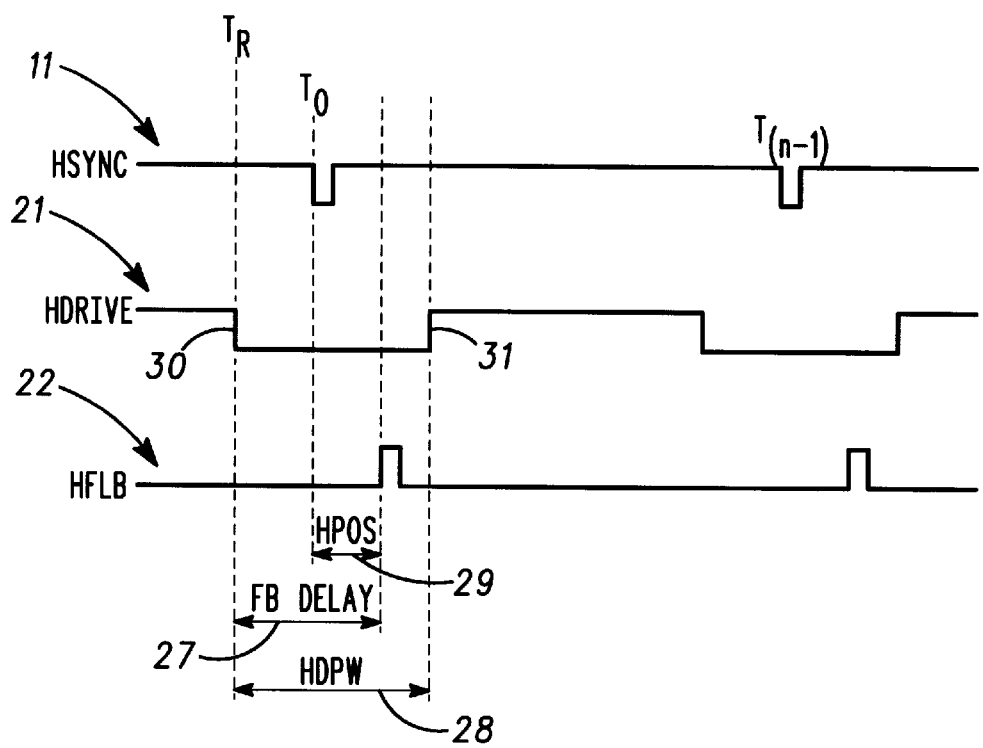
FIG. 2 shows the relationship between signals associated with the block diagram shown in FIG. 1.

As explained above, the horizontal position of an electron beam on the screen of a cathode ray tube (CRT) is dependent on a horizontal drive (HDRIVE) signal 21, as shown in FIG. 2. The HDRIVE signal 21 comprises a pulse having a period corresponding to the length of each line of the video signal to be displayed on the CRT. The pulse period is determined by the pulse width (HDPW), shown by arrow 28 in FIG. 2, which varies according to the characteristics of the driver circuit in the monitor and the value required for HDPW is preset by the manufacturer in a register and provided as a set of digital signals 25.

One edge of the HDRIVE signal pulse is used to control the electron beam to "flyback" from the end of one line on the CRT to the beginning of the next line by changing the direction of the current through the magnetic coils controlling the position of the electron beam. When this happens, the sudden change in direction of current through the coils causes a voltage "flyback" pulse to be generated, as shown in FIG. 2 by Horizontal Flyback (HFLB) signal 22. However, there is a delay, shown in FIG. 2 by arrow 27, between the timing of the edge of the horizontal drive signal pulse and the flyback pulse. This delay is variable depending on various factors, including the type of monitor and resolution being used and the ambient temperature and is not programmable.

A horizontal synchronisation (HSYNC) signal 11 is also provided having a horizontal synchronisation pulse for timing purposes. The frequency of the HSYNC signal 11 is the same as the frequency of the HDRIVE signal 21, but the two signals are not necessarily in phase with each other, since the HDRIVE signal 21 must be adjusted to compensate for the variability of the flyback delay and in order to adjust the horizontal position of the video signal displayed on the CRT screen.

The actual horizontal position of the video signal on the CRT screen is set by a horizontal position delay HPOS between the timing of an edge of the horizontal synchronisation pulse and the flyback pulse, as shown by arrow 29 in FIG. 2. However, since the timing of the flyback pulse is variably delayed with respect to the timing of the edge of the horizontal drive pulse, it is necessary to have some way of generating the horizontal drive signal such that the edge of the horizontal drive signal pulse is generated at the correct time to cause the flyback pulse to occur with the set horizontal position delay after the edge of the horizontal synchronisation pulse.

Figure 1:
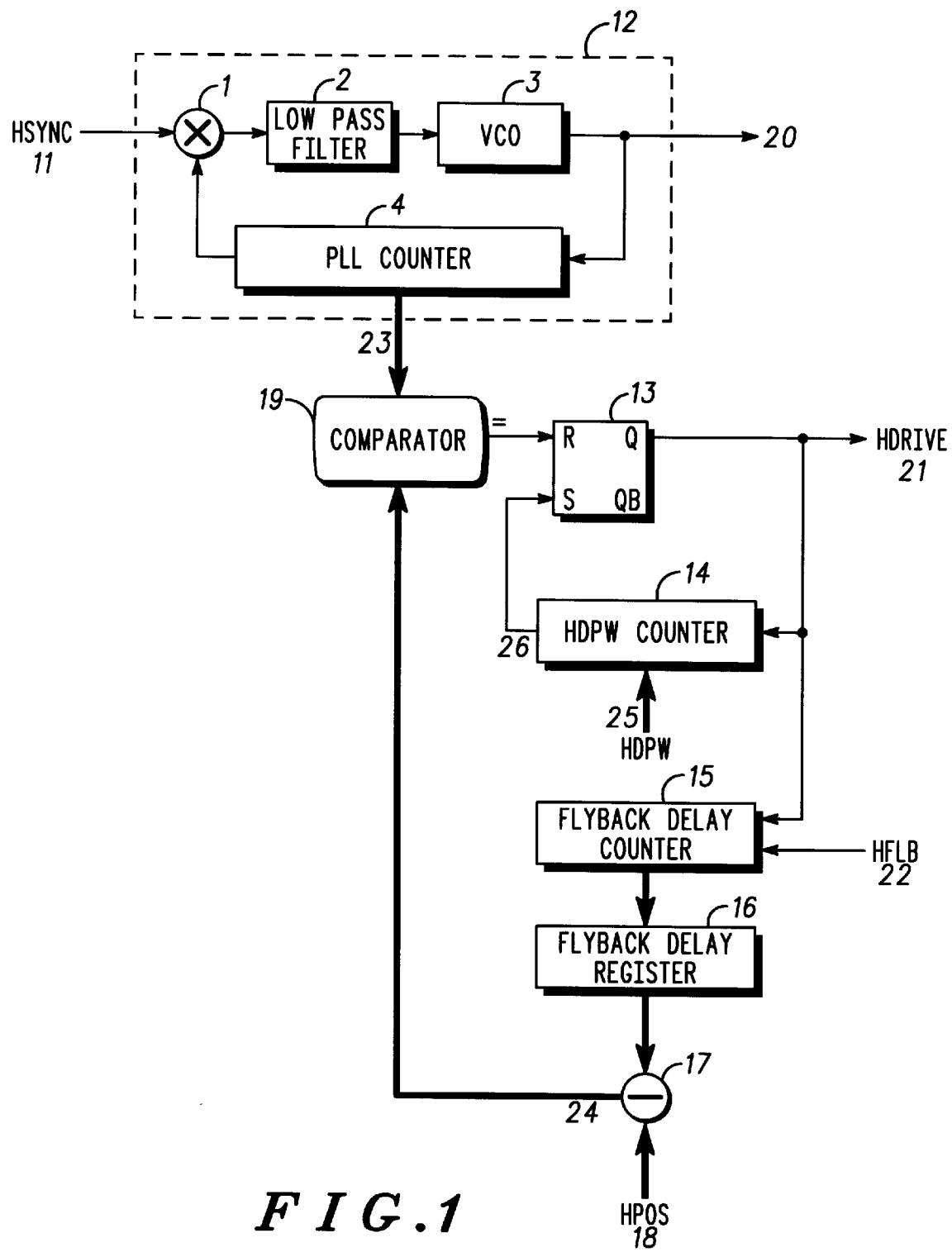
FIG. 1 shows the block diagram of a digital horizontal flyback control circuit in accordance with the present invention.

Thus, as shown in FIG. 1 of the drawings, a Phase Locked Loop (PLL) 12 comprising a phase detector 1, a Low Pass Filter (LPF) 2, a Voltage Controlled Oscillator (VCO) 3 and a PLL counter 4 is used to generate a clock signal 20 in a known manner. The clock signal 20 is used as the clock for all the counters in the rest of the circuit, as described below. The PLL 12 uses the HSYNC signal 11 generated by the video card in a computer as the reference clock frequency. The PLL counter 4 is a divide-by-n counter so that the frequency of the clock signal 20 generated by the PLL 12 is n times the frequency of the HSYNC signal 11, where n can be as large as the circuit speed allows. The larger the value of n allowed, the finer will be the steps available for horizonal position adjustment. The value of the PLL counter 4 is taken as a set output 23 from the PLL 12. The value at the set output 23 indicates the timing position with reference to the leading edge of HSYNC signal 11. $T_x$ is used to indicate the timing position when the PLL counter value at set output 23 is equal to x, where x ranges from 0 to (n-1), so that $T_0$ indicates the time of the beginning of a horizontal cycle starting from the leading edge of HSYNC signal 11 and $T_{(n-1)}$ indicates the time of the end of the horizontal cycle, as shown in FIG. 2.

A flyback delay counter 15 is used to count the flyback delay 27 from the negative edge 30 of the HDRIVE signal 21 to the leading edge of the HFLB pulse 22 received from a horizontal yoke of the CRT (not shown). The flyback delay counter 15 is reset at the negative edge 30 of HDRIVE signal 21 and proceeds to count until the leading edge of HFLB pulse 22 arrives. Then the value in the flyback delay counter 15 is loaded into a flyback delay register 16 depending on the value already stored in the flyback delay register 16. To prevent jittering, a hysteresis check is performed before loading. Thus, the value in the flyback delay counter 15 is loaded into the flyback delay register 16 only if the two values differ by more than a certain number. Otherwise, the flyback delay register 16 retains its previous value. In this way, a stable delay time from the negative edge 30 of HDRIVE signal 21 to the leading edge of HFLB pulse 22 is obtained in the flyback delay register 16.

A set input providing a horizontal position (HPOS) signal 18 is provided to enable users to perform fine adjustment of the desired horizontal display position. The intent is to provide an adjustable positive or negative time delay from the leading edge of HSYNC signal 11 to the leading edge of HFLB pulse 22, as shown in FIG. 2. The value of the time delay is provided by HPOS signal 18. To obtain the time position TR when the negative edge 30 of HDRIVE signal 21 should be generated, the value in the flyback delay register 16 is subtracted from the value of HPOS signal 18 by a subtractor 17. From the timing relationship of the signals shown in FIG. 2, it will be seen that the set ouput 24 of the subtractor 17 actually represents the time TR at which the negative edge 30 of the HDRIVE signal 21 should occur.

A comparator 19 is used to compare the set value 23 from the PLL counter 4 with the value at the set output 24 of the substractor 7. If these two values are determined to be the same, the output of the comparator 19 is used to reset a latch 13 whose output provides the HDRIVE signal 21. Consequently the negative edge 30 is generated in the HDRIVE signal 21.

A horizontal drive pulse width (HDPW) counter 14 is used to count the low period of HDRIVE signal 21. The HDPW signal 25 is used to provide a predetermined value, which specifies the low period of HDRIVE signal 21, as a set input to the HDPW counter 14. The HDPW counter 14 is pre-loaded with the value of HDPW signal 25 at the negative edge of HDRIVE signal 21 and starts counting down thereafter. When the HDPW counter 4 reaches zero, an output signal 26 is generated to set the latch 13 and consequently generate a positive edge 31 in the HDRIVE signal 21.

Thus, the HDRIVE signal 21 is generated with a negative edge at the desired time TR set by the value of the Flyback Delay subtracted from the HPOS value and a width set by the value of HDPW.

It will be appreciated that although only one particular embodiment of the invention has been described in detail, various modifications and improvements can be made by a person skilled in the art without departing from the scope of the present invention.

I claim:

1. A digital horizontal flyback control circuit comprising:
a first input for receiving a horizontal drive signal comprising a series of pulses;
a second input for receiving a flyback signal comprising a series of pulses generated when a video display beam is caused to move from an end of one line of a display to a beginning of a next line of the display by a predetermined edge of a horizontal drive signal pulse, the flyback pulse being delayed with respect to the horizontal drive signal pulse by a flyback delay period;
a measuring circuit coupled to the first and second inputs for measuring the flyback delay period and producing a flyback delay value at an output thereof;
a subtractor circuit coupled to the output of the measuring circuit for subtracting the flyback delay value from a set horizontal position value representing a desired delay between the flyback pulse and a reference pulse and producing a subtraction value at an output thereof;
a comparator coupled to the output of the subtractor circuit for comparing the subtraction value with the value of a clock counter whose count value is reset by the reference pulse and producing a set signal at an output when the subtraction value and the clock count value are the same; and
a control circuit having an input coupled to the output of the comparator for generating a control signal at an output thereof for controlling the horizontal drive signal such that the horizontal drive signal pulse is generated when the set signal is received from the comparator.

2. A digital horizontal flyback control circuit comprising:
a phase locked loop (PLL) having an input for receiving a horizontal synchronisation signal at a synchronisation frequency and an output for providing a clock signal generated from the horizontal synchronisation signal at a clock frequency, the clock frequency being higher than the synchronisation frequency, the PLL including a PLL counter for counting the clock signal at the clock signal frequency and having an output for providing a clock count value;
a horizontal drive signal generator for generating a horizontal drive signal comprising a series of pulses;
a flyback delay counter having a clock input coupled to the output of the PLL for receiving the clock signal, a first input for receiving the horizontal drive signal, and a second input for receiving a flyback signal comprising a series of pulses generated when a video display beam is caused to move from an end of one line of a display to a beginning of a next line of the display by a predetermined edge of a horizontal drive signal pulse, the flyback pulse being delayed with respect to the horizontal drive signal pulse by a flyback delay period, the counter being arranged to count, at the clock frequency, starting when the predetermined edge of a pulse of the horizontal drive signal is received until the flyback pulse is received and then to produce a flyback delay count value at an output thereof;
a subtractor circuit having a first input for receiving a set position value representative of a desired horizontal position of the video display beam on the display, a second input coupled to the output of the flyback delay circuit for receiving the flyback delay count value and an output for providing a horizontal drive delay value produced by subtracting the flyback delay count value from the set position value;
a comparator having a first input coupled to the output of the subtractor circuit for receiving the flyback delay count value, a second input coupled to the output of the PLL counter for receiving the clock count value and an output for providing a reset signal when the flyback delay count value and the clock count value are the same; and
a latch circuit having a reset input coupled to the output of the comparator for receiving the reset signal therefrom and for generating a latch output signal at an output thereof when the reset signal is received;
wherein the output of the latch circuit is coupled to the horizontal drive signal generator for controlling the horizontal drive signal generator to generate the horizontal drive signal such that the predetermined edge of the horizontal drive signal occurs when the latch output signal is received by the horizontal drive signal generator.

3. A digital horizontal flyback control circuit according to claim 2, further comprising:
a horizontal drive counter having a clock input coupled to the output of the PLL for receiving the clock signal, a first input for receiving the horizontal drive signal, and a second input for receiving a set value representative of a desired pulse width of the horizontal drive signal, the counter being arranged to count, at the clock frequency, starting when the predetermined edge of a pulse of the horizontal drive signal is received until the set value is reached and then to produce a set signal at an output thereof;
wherein the latch circuit has a set input coupled to the output of the horizontal drive counter for receiving the set signal therefrom and for generating the latch output signal when the set signal is received.

* * * * *